(12) United States Patent
Xiao et al.

(10) Patent No.: US 11,362,118 B2
(45) Date of Patent: Jun. 14, 2022

(54) ARRAY SUBSTRATE, MANUFACTURING METHOD THEREOF, AND DISPLAY PANEL

(71) Applicant: WUHAN CHINA STAR OPTOELECTRONICS TECHNOLOGY CO., LTD., Hubei (CN)

(72) Inventors: Juncheng Xiao, Hubei (CN); Chao Tian, Hubei (CN); Yanqing Guan, Hubei (CN); Haiming Cao, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 161 days.

(21) Appl. No.: 16/756,350

(22) PCT Filed: Nov. 15, 2019

(86) PCT No.: PCT/CN2019/118917
§ 371 (c)(1),
(2) Date: Apr. 15, 2020

(87) PCT Pub. No.: WO2021/035991
PCT Pub. Date: Mar. 4, 2021

(65) Prior Publication Data
US 2021/0408082 A1 Dec. 30, 2021

(30) Foreign Application Priority Data
Aug. 23, 2019 (CN) .......................... 201910781741.0

(51) Int. Cl.
*H01L 27/00* (2006.01)
*H01L 27/12* (2006.01)
(Continued)

(52) U.S. Cl.
CPC ........ *H01L 27/1251* (2013.01); *H01L 27/127* (2013.01); *G09G 3/3225* (2013.01);
(Continued)

(58) Field of Classification Search
CPC ............... H01L 27/1251; H01L 27/127; H01L 27/1225; G09G 3/3225; G09G 3/3648;
(Continued)

(56) References Cited

U.S. PATENT DOCUMENTS 10,043,833 B2 * 8/2018 Yoneda ................. H01L 27/124
10,770,163 B2 * 9/2020 Wang ................... G11C 19/287
(Continued)

FOREIGN PATENT DOCUMENTS

CN     105633101 A    6/2016
CN     105720056 A    6/2016
(Continued)

*Primary Examiner* — Nikolay K Yushin

(57) ABSTRACT

The present invention provides an array substrate, a manufacturing method thereof, and a display panel. Orthographic projections of channel layers of two types of thin film transistors in a design of a driving circuit on the array substrate at least partially overlap, that is, two thin film transistors are stacked on top of each other, thereby facilitating a narrow border design of the display panel. In addition, a channel layer of one of the thin film transistors is an amorphous oxide semiconductor layer, which can reduce node leakage in the driving circuit, which is conducive to improving circuit stability and reducing power consumption.

13 Claims, 7 Drawing Sheets

(51) Int. Cl.
 *G09G 3/3225* (2016.01)
 *G09G 3/36* (2006.01)
(52) U.S. Cl.
 CPC ... *G09G 3/3648* (2013.01); *G09G 2300/0426* (2013.01); *G09G 2310/08* (2013.01); *H01L 27/1225* (2013.01)
(58) Field of Classification Search
 CPC .. G09G 3/2092; G09G 3/3266; G09G 3/3677; G09G 2300/0426; G09G 2300/0408; G09G 2300/0871; G09G 2310/08; G09G 2310/0262; G09G 2310/0267; G09G 2310/0286
 See application file for complete search history.

(56) References Cited

U.S. PATENT DOCUMENTS

| | | |
|---|---|---|
| 2015/0325602 A1 | 11/2015 | Im |
| 2016/0079285 A1 | 3/2016 | Chiang et al. |
| 2017/0033130 A1 | 2/2017 | Yoneda et al. |
| 2018/0197895 A1 | 7/2018 | Liu |
| 2019/0129547 A1 | 5/2019 | Dai |
| 2019/0304559 A1* | 10/2019 | Wang .................. G09G 3/3266 |
| 2021/0233820 A1 | 7/2021 | Liu et al. |

FOREIGN PATENT DOCUMENTS

| | | |
|---|---|---|
| CN | 106920801 A | 7/2017 |
| CN | 107742509 A | 2/2018 |
| EP | 3089212 A1 | 11/2016 |

* cited by examiner

ARRAY SUBSTRATE, MANUFACTURING METHOD THEREOF, AND DISPLAY PANEL

FIELD OF INVENTION

The present invention relates to the field of display technologies, and in particular, to an array substrate, a manufacturing method thereof, and a display panel.

BACKGROUND OF INVENTION

With improvement of display panels' pixels per inch (PPI) and industries' demand for narrow borders (borderless), a number of stages of gate driver on array (GOA) circuits has gradually increased, which causes widths of the GOA circuits to gradually narrow. This will undoubtedly increase difficulty of arrangements of thin film transistors (TFTs) and capacitors in the GOA circuits, and make designs of the GOA circuits less flexible.

Technical Problem

Current driving circuits are not good for narrow border designs of display panels.

Technical Solution

An array substrate provided by the present invention comprise a driving circuit comprising a first thin film transistor and a second thin film transistor, wherein the second thin film transistor is disposed on a leakage path between a pull-down control node and a pull-up control node of the driving circuit; wherein a channel layer of the second thin film transistor is disposed above a channel layer of the first thin film transistor, and orthographic projections of the two channel layers on the array substrate at least partially overlap.

A display panel provided by the present invention comprises an array substrate, wherein a driving circuit of the array substrate comprises a first thin film transistor and a second thin film transistor, the second thin film transistor is disposed on a leakage path between a pull-down control node and a pull-up control node of the driving circuit, a channel layer of the second thin film transistor is disposed above a channel layer of the first thin film transistor, and orthographic projections of the two channel layers on the array substrate at least partially overlap.

The present invention provides a manufacturing method of an array substrate, wherein a driving circuit of the array substrate comprises a first thin film transistor and a second thin film transistor, and the second thin film transistor is disposed on a leakage path between a pull-down control node and a pull-up control node of the driving circuit, wherein the manufacturing method comprises following steps of:

providing a substrate;

forming the first thin film transistor and the second thin film transistor on the substrate, wherein a channel layer of the second thin film transistor is disposed above a channel layer of the first thin film transistor, and orthographic projections of the two channel layers on the array substrate at least partially overlap; and forming a passivation layer covering the second thin film transistor.

Beneficial Effect

In the present invention, by designing a channel layer of a second thin film transistor of a driving circuit disposed above a channel layer of a first thin film transistor, and having orthographic projections of the two channel layers on the array substrate at least partially overlap, that is, the two thin film transistors are disposed to be stacked on top of each other, so that a width of a border actually occupied by the two thin film transistors is less than a sum of widths of the two thin film transistors, a narrow border design of a display panel can be facilitated.

DETAILED DESCRIPTION OF PREFERRED EMBODIMENTS

Figure 1:
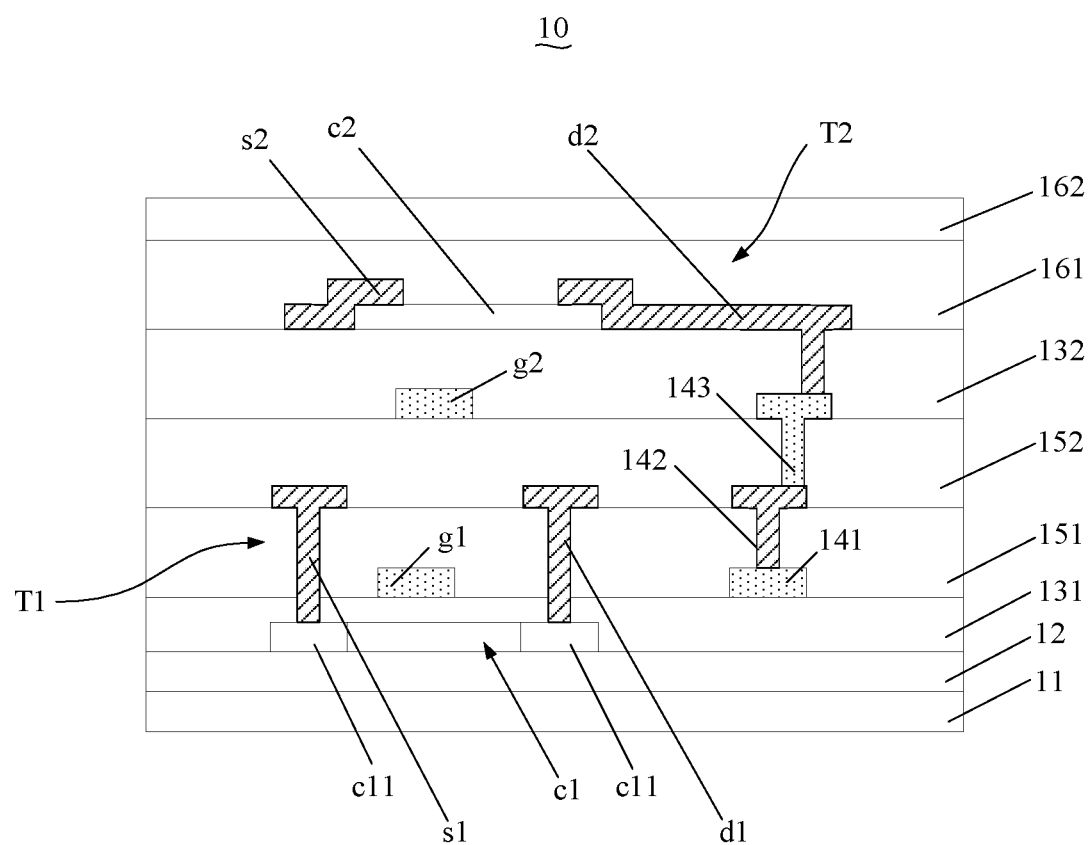
FIG. 1 is a schematic structural view of an embodiment of an array substrate according to the present invention.

The technical solutions of various exemplary embodiments provided by the present invention will be clearly and completely described below with reference to the accompanying drawings in the embodiments of the present invention. In the case of no conflict, the following embodiments and their technical features can be combined with each other.

Directional terms mentioned in the present invention, such as up, down, top, bottom, front, back, left, right, inner, outer, side, surrounding, center, flat, horizontal, vertical, longitudinal, axial, radial, uppermost or lowermost, etc., only refer to directions of drawings. Therefore, the directional terms used is for the purpose of illustration and understanding of the disclosure rather than limiting the disclosure. In addition, for structural elements with the same or similar characteristics, the present invention uses the same reference numerals to identify them.

FIG. 1 is a schematic structural view of an embodiment of an array substrate of the present invention. Please refer to FIG. 1, an array substrate 10 comprises a first thin film transistor T1 and a second thin film transistor T2. The first thin film transistor T1 comprises a first gate g1, a first channel layer c1, a first source s1, and a first drain d1. The second thin film transistor T2 comprises a second gate g2, a second channel layer c2, a second source s2, and a second drain d2. In a horizontal direction, most of the first channel layer c1 is disposed between the first source s1 and the first drain d1, and most of the second channel layer c2 is disposed between the second source s2 and the second drain d2.

In the embodiment, the second channel layer c2 is disposed above the first channel layer c1, and orthographic projections of the two channel layers on the array substrate 10 at least partially overlap. Since the first channel layer c1 and the second channel layer c2 largely determine positions of the first thin film transistor T1 and the second thin film transistor T2 on the array substrate 10, the first thin film transistor T1 and the second thin film transistor T2 are stacked on top of each other. A size (i.e. a width) of the two thin film transistors in the horizontal direction is less than a sum of widths of the two thin film transistors. For example, when the first thin film transistor T1 and the second thin film transistor T2 completely overlap with each other, the width actually occupied by them is a width of one thin film transistor. In a specific embodiment, an arrangement of the first thin film transistor T1 and the second thin film transistor T2 can be applied to a driving circuit of the display panel, and can be disposed in a non-display region of the display panel, so as to facilitate a design of a narrow border of the display panel.

It should be understood that the driving circuit of the display panel may further comprise other structural elements provided on the array substrate 10, which will be described below with reference to FIG. 1.

Please continue to refer to FIG. 1. The array substrate 10 comprises a substrate 11 and a buffer layer 12, the first channel layer c1, a first gate insulating layer 131, a first conductive portion 141, the first gate g1, a first dielectric layer 151, the first source s1, the first drain d1, a second conductive portion 142, a second dielectric layer 152, the second gate g2, a third conductive portion 143, a second gate insulating layer 132, the second source s2, the second drain d2, the second channel layer c2, and a passivation layer 161 disposed on the substrate 11.

Doped regions c11 are disposed at both ends of the first channel layer c1. A side of each doped region c11 near a middle of the first channel layer c1 may be an N-type lightly doped region. Accordingly, a side far from the middle of the first channel layer c1 may be an N-type heavily doped region.

The first gate insulating layer (GI) 131 covers the buffer layer 12 and covers the first channel layer c1.

The first gate g1 and the first conductive portion 141 are disposed on the first gate insulating layer 131 in a same layer and spaced apart from each other. The first gate g1 is disposed above the first channel layer c1. Main materials of the first conductive portion 141 and the first gate g1 may be a same conductive material, for example, both may be copper or molybdenum, and both may be made through a same mask etching process.

The first dielectric (or interlayer dielectric isolation, ILD) layer 151 covers the first gate insulating layer 131, and covers the first conductive portion 141 and the first gate g1. In addition, the first dielectric layer 151 is provided with a source via hole, a drain via hole, and a first via hole. Wherein, the source via hole and the drain via hole are spaced apart from each other in a horizontal direction, and both pass through the first dielectric layer 151 and the first gate insulating layer 131 and respectively expose the doped regions c11 at both ends of the first channel layer c1. The first via hole passes through the first dielectric layer 151 and exposes an upper surface of the first conductive portion 141.

The first source s1, the first drain d1, and the second conductive portion 142 are disposed on the first dielectric layer 151. In addition, the first source s1 and the first drain d1 respectively pass through the source via hole and the drain via hole and contact the doped region c11. A part of the second conductive portion 142 is disposed in the first via hole and is in contact with the upper surface of the first conductive portion 141. Main materials of the first source s1, the first drain d1, and the second conductive portion 142 can be a same conductive material, for example, they can all be copper or molybdenum, and the three can be obtained through a same mask etching process.

The second dielectric layer 152 is disposed on the first dielectric layer 151 and covers the first source s1, the first drain d1, and the second conductive portion 142. The second dielectric layer 152 is provided with a second via hole exposing an upper surface of the second conductive portion 142.

The second gate g2 and the third conductive portion 143 are disposed on the second dielectric layer 152 and are spaced from each other. The second gate g2 is disposed above the first channel layer c1, and a part of the third conductive portion 143 is disposed in the second via hole and is in contact with the second conductive portion 142. Main materials of the second gate g2 and the third conductive portion 143 may be a same conductive material, for example, they may both be copper or molybdenum, and both may be made through a same mask etching process.

The second gate insulating layer 132 covers the second dielectric layer 152 and covers the second gate g2 and the third conductive portion 143. The second gate insulating layer 132 is provided with a third via hole, and the third via hole exposes an upper surface of the third conductive portion 143.

The second source s2, the second drain d2, and the second channel layer c2 are disposed on the second gate insulating layer 132. The second source s2 and the second drain d2 are in contact with both ends of the second channel layer c2, and a part of the second drain d2 is disposed in the third via hole and is in contact with the third conductive portion 143.

The passivation (PV) layer 161 covers the second gate insulating layer 132 and covers the second source s2, the second drain d2, and the second channel layer c2.

Of course, in order to ensure surface flatness, the array substrate 10 may further be provided with a planarization layer (PLN) 162 whose upper surface is a horizontal plane, and the planarization layer 162 covers the passivation layer 161.

In a specific embodiment, a main material of the first channel layer c1 may be polysilicon, and a main material of the second channel layer c2 may be an amorphous oxide semiconductor, such as indium gallium zinc oxide (IGZO). Therefore, the first thin film transistor T1 and the second thin film transistor T2 respectively use polysilicon technology and amorphous oxide semiconductor technology. The driving circuit of the array substrate 10 uses low temperature polycrystalline oxide (LTPO) technology, and has advantages of low power consumption of low temperature polysilicon (LTPS) technology and strong driving capability of amorphous oxide semiconductor technology, which can help improve circuit stability of the display panel and reduce power consumption.

The display panel may be a liquid crystal panel or an active matrix organic light emitting diode (AMOLED) panel. The display panel has at least same beneficial effects as the array substrate 10 described above.

Figure 2:
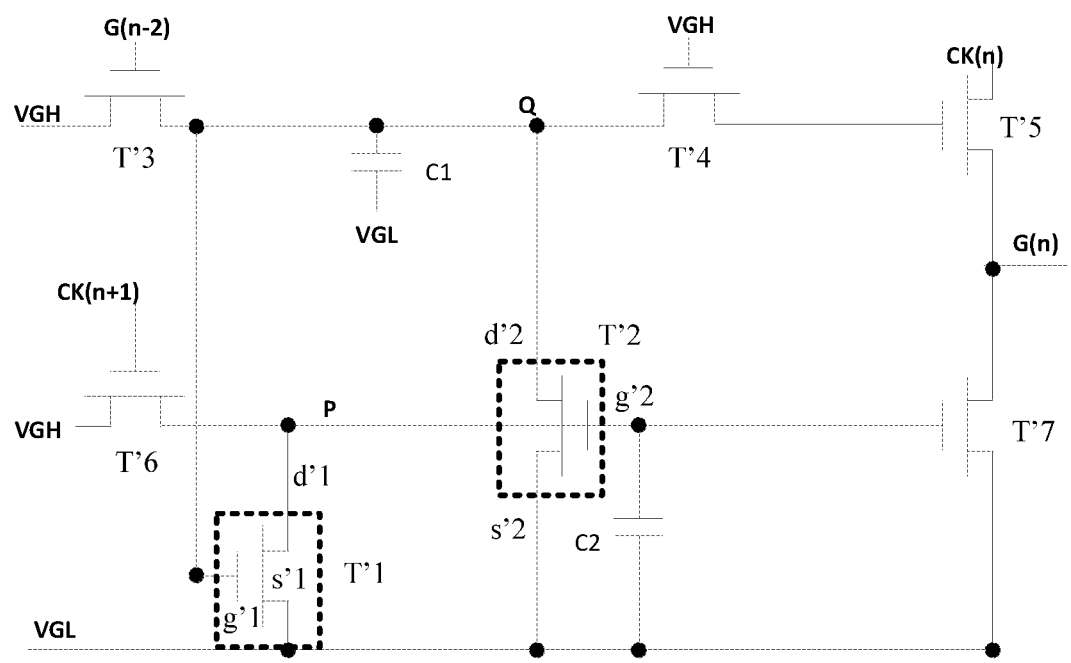
FIG. 2 is a circuit equivalent view of an embodiment of a driving circuit according to the present invention.

The driving circuit may be a GOA circuit. As shown in FIG. 2, the driving circuit comprises seven thin film transistors T'1 to T'7, a capacitor C1, and a capacitor C2, wherein:

A gate g'1 of the thin film transistor T'1 is connected to a drain of the thin film transistor T'3, a source s'1 of the thin film transistor T'1 is connected to a negative voltage input pin VGL, and a drain d'1 of the thin film transistor T'1 is connected to a point P. A gate g'2 of the thin film transistor T'2 is connected to an electrode of the capacitor C2, a source s'2 of the thin film transistor T'2 is connected to the negative voltage input pin VGL, and a drain d'2 of the thin film transistor T'2 is connected to a point Q. A drain of the thin film transistor T'3, an electrode of the capacitor C1, and the source of the thin film transistor T'4 are all connected to the point Q. A source of the thin film transistor T'3 is connected to a positive voltage input pin VGH, and a gate of the thin film transistor T'3 is connected to an (n−2) level scanning line G(n). A gate of the thin film transistor T'4 is connected to the positive voltage input pin VGH, and a drain of the thin film transistor T'4 is connected to a gate of the thin film transistor T'5. A drain of the thin film transistor T'5 is connected to an n level clock signal CK(n), and a source of the thin film transistor T'5 and a drain of the thin film transistor T'7 are connected to an n level scan line G(n). A source of the thin film transistor T'7 is connected to the negative voltage input pin VGL, and a gate of the thin film transistor T'7 and a drain of the thin film transistor T'6 are connected to the point P. A gate of the thin film transistor T'6 is connected to an n+1 level clock signal CK(n+1), and a source of the thin film transistor T'6 is connected to the positive voltage input pin VGH. Another electrode of capacitor C2 and another electrode of capacitor C1 are connected to the negative voltage input pin VGL.

The point P is a pull-down control node, and the point Q is a pull-up control node. The thin film transistor T'1 is used to control a voltage at the point P, and thin film transistor T'2 is used to control a voltage at the point Q. The thin film transistor T'1 and the thin film transistor T'2 are disposed on a leakage path between the pull-down control node and the pull-up control node of the driving circuit, both of which are equivalent to the mentioned second thin film transistor T2. The other thin film transistors T'3 to T'7 are equivalent to the first thin film transistor T1, respectively.

Figure 3:
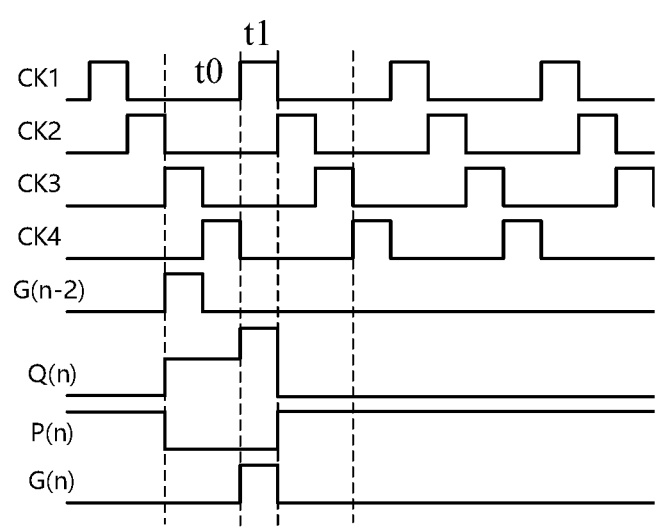
FIG. 3 is a 4CK timing view of the driving circuit shown in FIG. 2.

Please refer to FIG. 2 and FIG. 3 together, t0 is a charging time of Gn-level at the point Q, t1 is the pull-up time of Gn-level at the point Q, and the point P remains high when the point Q is low.

Figure 4:
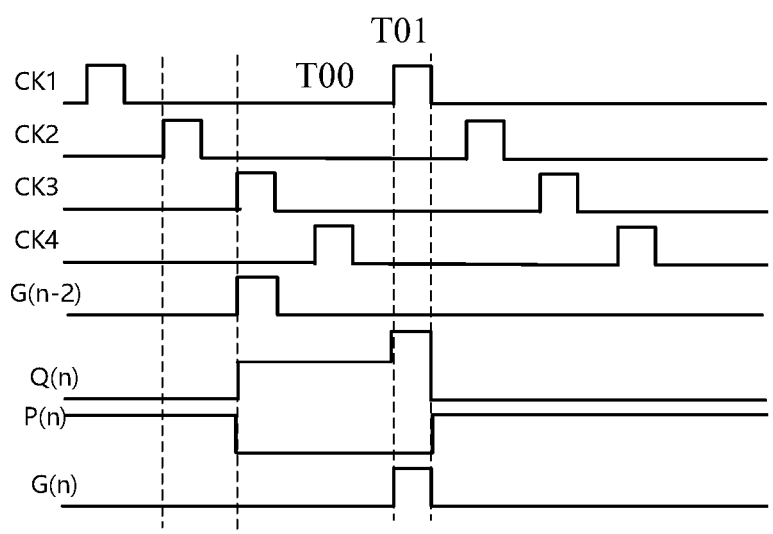
FIG. 4 is a schematic view of the 4CK timing of the driving circuit shown in FIG. 2 when operating at low frequencies.

Please refer to FIG. 2 and FIG. 4 together. FIG. 4 is a timing view of the driving circuit at low frequencies. T00 is a charging time of Gn-level at the point Q, T01 is a pull-up time of Gn-level at the point Q, and the point P remains high when the point Q is low.

According to this, when a low frequency (for example, 1 Hz) works, a time for the point Q to be high is (T00+T01). When it is greater than (t0+t1), the time for the point Q to be high will be greatly extended. During a period when the point Q is maintained at a high level, if a certain leakage current (Ioff) exists in the second thin film transistor T2, level stability of the GOA will undoubtedly be reduced, thereby reducing stability of the GOA circuit. In the embodiment of the present invention, the second thin film transistor T2 uses an amorphous oxide semiconductor technology. The electrical properties of the amorphous oxide semiconductor are stable, and risk of leakage current is low, which can reduce leakage of the point Q and improve stability of the driving circuit.

Figure 5:
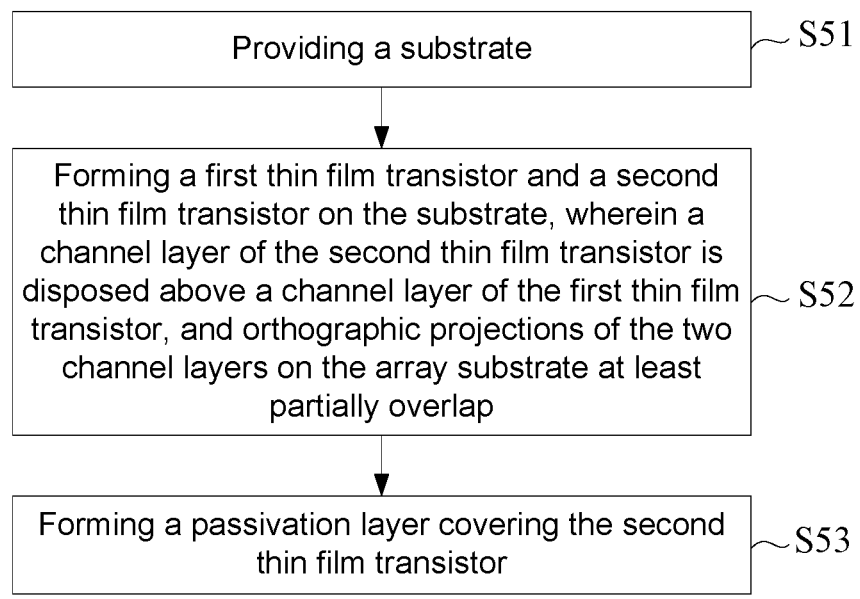
FIG. 5 is a schematic flowchart of an embodiment of a manufacturing method of the array substrate according to the present invention.

The embodiment of the present invention further provides a manufacturing method of the array substrate, which can be used for manufacturing the array substrate 10 of the foregoing embodiment. FIG. 5 is a schematic flowchart of an embodiment of the manufacturing method of the array substrate according to the present invention. As shown in FIG. 5, the manufacturing method may comprise steps S51 to S53.

S51: providing a substrate.

S52: forming a first thin film transistor and a second thin film transistor on the substrate, wherein a channel layer of the second thin film transistor is disposed above a channel layer of the first thin film transistor, and orthographic projections of the two channel layers on the array substrate at least partially overlap.

S53: forming a passivation layer covering the second thin film transistor.

Figure 6:
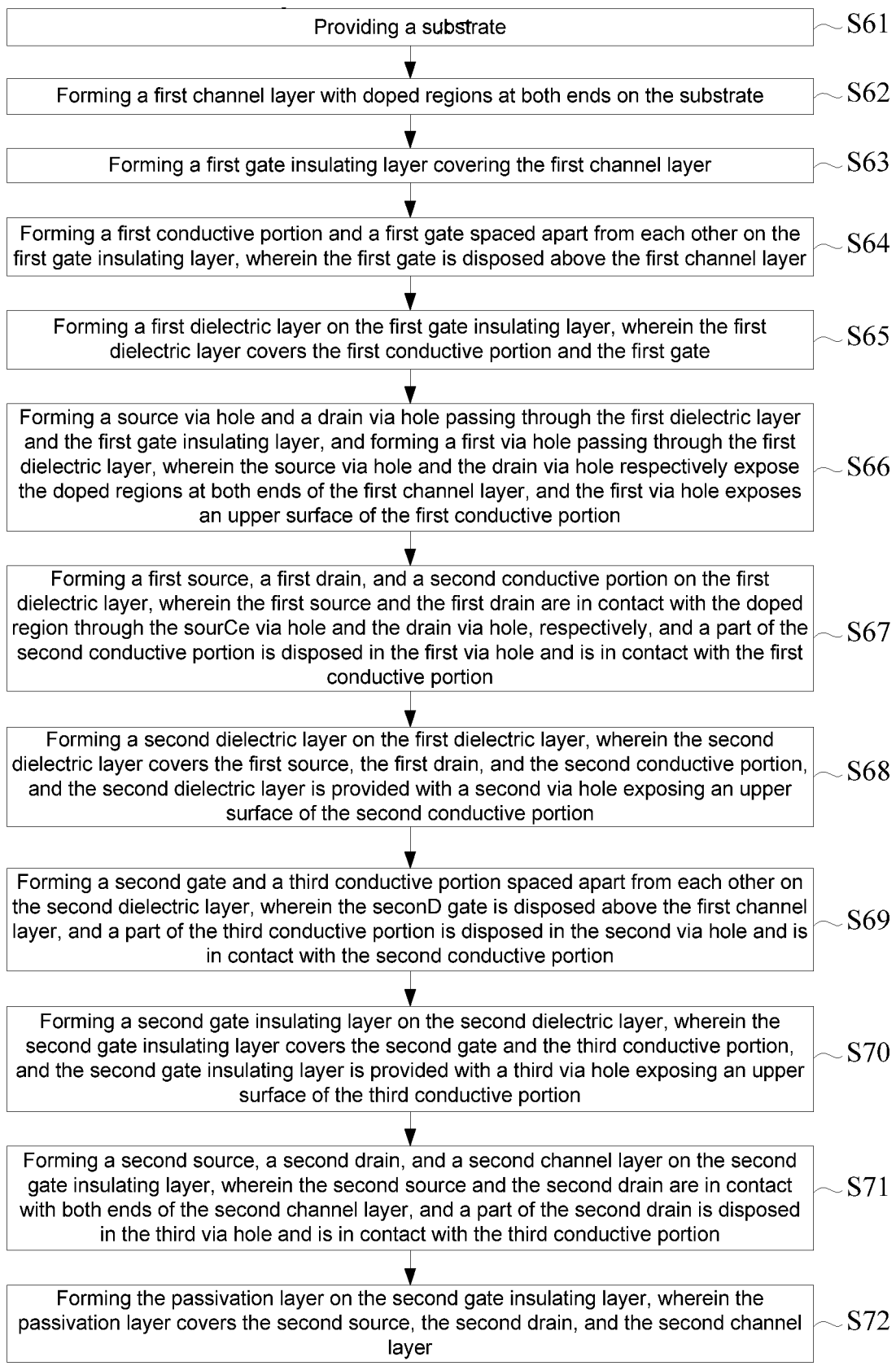
FIG. 6 is a schematic flowchart of another embodiment of the manufacturing method of the array substrate according to the present invention.
Figure 7:
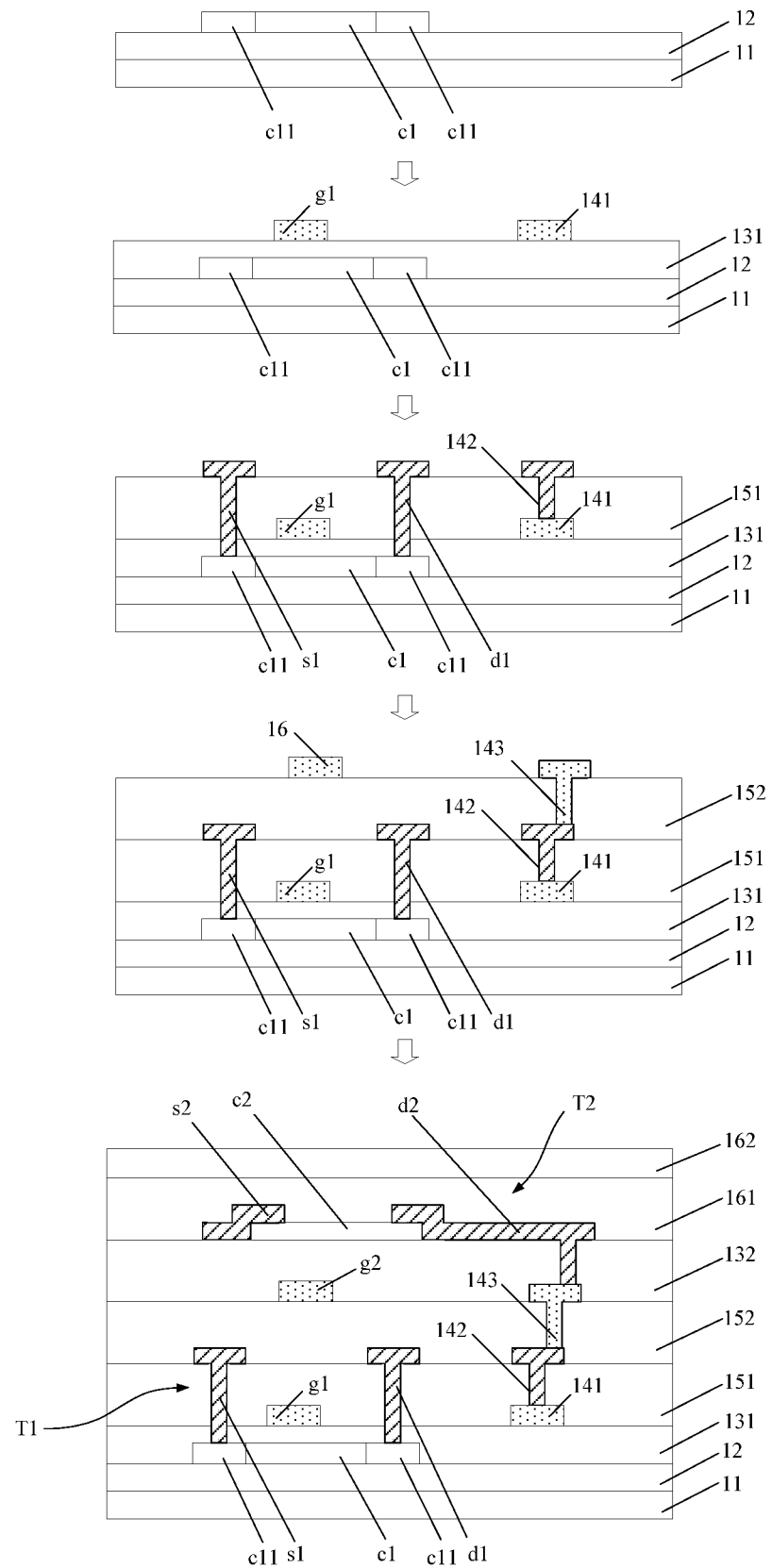
FIG. 7 is a schematic view of a scene of manufacturing the array substrate based on the method shown in FIG. 6.

Specifically, for manufacturing other structural elements of the array substrate 10 of the embodiment shown in FIG. 1, the manufacturing method of the embodiment can refer to FIG. 6. Please refer to FIG. 6 and FIG. 7 together. The manufacturing method shown may comprise steps S61 to S72.

S61: providing a substrate.

The substrate 11 comprise, but is not limited to, a light transmitting substrate such as a glass substrate, a plastic substrate, and a flexible substrate. In the embodiment, a physical vapor deposition (PVD) method can be used to form a full surface buffer layer 12 on the substrate 11, and then to form subsequent layers on the buffer layer 12, such as a first channel layer c1 of step S62.

S62: forming a first channel layer with doped regions at both ends on the substrate.

In the embodiment, a mask etching process M1 can be used to form the first channel layer c1. The principle of the mask etching process is as follows: firstly, a whole polysilicon layer is formed on the buffer layer 12, and a photoresist layer is covered on the polysilicon layer. A mask is then used to expose the photoresist layer. The photoresist layer in an exposed region is developed and removed, and the polysilicon layer is exposed. An unexposed region of the photoresist layer remains, and the exposed polysilicon layer is further etched and removed. As a result, the polysilicon layer blocked by the remaining photoresist layer is retained. Finally, the remaining photoresist layer is removed to obtain a polysilicon layer with a same pattern as the first channel layer c1, and it is then doped.

S63: forming a first gate insulating layer covering the first channel layer.

S64: forming a first conductive portion and a first gate spaced apart from each other on the first gate insulating layer, wherein the first gate is disposed above the first channel layer.

In the embodiment, a mask etching process M2 may be used to form the first conductive portion 141 and the first gate g1, and when the exposed photoresist layer in the mask etching process is not completely removed, the first channel layer c1 is doped. It should be understood that the principle of the mask etching process in the article is similar. For details, please refer to the prior art.

A middle of the first channel layer c1 becomes an undoped region due to shielding of the first gate g1, and the both ends become the doped regions c11 because they are not shielded. A side of each doped region c11 near the middle of the first channel layer c1 may be an N-type lightly doped region. Accordingly, a side far from the middle of the first channel layer c1 may be an N-type heavily doped region.

S65: forming a first dielectric layer on the first gate insulating layer, wherein the first dielectric layer covers the first conductive portion and the first gate.

S66: forming a source via hole and a drain via hole passing through the first dielectric layer and the first gate insulating layer, and forming a first via hole passing through the first dielectric layer, wherein the source via hole and the drain via hole respectively expose the doped regions at both ends of the first channel layer, and the first via hole exposes an upper surface of the first conductive portion.

In the embodiment, a mask etching process M3 can be used to form the source via hole, the drain via hole, and the first via hole.

S67: forming a first source, a first drain, and a second conductive portion on the first dielectric layer, wherein the first source and the first drain are in contact with the doped region through the source via hole and the drain via hole, respectively, and a part of the second conductive portion is disposed in the first via hole and is in contact with the first conductive portion.

In the embodiment, a mask etching process M4 can be used to form the first source s1, the first drain d1, and the second conductive portion 142.

S68: forming a second dielectric layer on the first dielectric layer, wherein the second dielectric layer covers the first source, the first drain, and the second conductive portion, and the second dielectric layer is provided with a second via hole exposing an upper surface of the second conductive portion.

In the embodiment, a mask etching process M5 can be used to form the second via hole.

S69: forming a second gate and a third conductive portion spaced apart from each other on the second dielectric layer, wherein the second gate is disposed above the first channel layer, and a part of the third conductive portion is disposed in the second via hole and is in contact with the second conductive portion.

In the embodiment, a mask etching process M6 can be used to form the second gate g2 and the third conductive portion 143.

S70: forming a second gate insulating layer on the second dielectric layer, wherein the second gate insulating layer covers the second gate and the third conductive portion, and the second gate insulating layer is provided with a third via hole exposing an upper surface of the third conductive portion.

S71: forming a second source, a second drain, and a second channel layer on the second gate insulating layer, wherein the second source and the second drain are in contact with both ends of the second channel layer, and a part of the second drain is disposed in the third via hole and is in contact with the third conductive portion.

In the embodiment, a mask etching process M7 is used to form the second channel layer c2, a mask etching process M8 is used to form the third via hole, and a mask etching process M9 is used to form the second source s2 and the second drain d2.

S72: forming a passivation layer on the second gate insulating layer, wherein the passivation layer covers the second source, the second drain, and the second channel layer.

From the above, it can be known that the above array substrate 10 can be made by 9 mask etching processes. The manufacturing method can obtain the array substrate having the same structure as the above-mentioned array substrate 10, and therefore has at least the above-mentioned beneficial effects.

Although the invention has been shown and described with respect to one or more implementations, equivalent alterations and modifications will occur to others skilled in the art based upon a reading and understanding of the specification and the annexed drawings. The present invention includes all such modifications and alterations, and is limited only by the scope of the appended claims. In particular regard to the various functions performed by the above described components, the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the specification.

That is, the above description is only an embodiment of the present invention, and not intended to limit the scope of the present invention, and all equivalent structures or equivalent processes performed by the content of the present specification and the attached drawings, such as the combination of technical features between various embodiments, or the direct or indirect application to other related technical fields, are included in the scope of the present invention.

In addition, while a particular feature of the specification may have been disclosed with respect to only one of several implementations, such feature may be combined with one or more other features of the other implementations as may be desired and advantageous for a given or particular application. Furthermore, to the extent that the terms "includes," has," "contains," or variants thereof are used in either the detailed description or the claims, such terms are intended to be inclusive in a manner similar to the term "comprising." Further, it should be understood that reference to "a plurality" herein means two or more.

What is claimed is:

1. An array substrate, comprising:
a driving circuit comprising a first thin film transistor and a second thin film transistor, wherein the second thin film transistor is disposed on a leakage path between a pull-down control node and a pull-up control node of the driving circuit;
wherein a channel layer of the second thin film transistor is disposed above a channel layer of the first thin film transistor, and orthographic projections of the two channel layers on the array substrate at least partially overlap;
wherein the array substrate comprises a first conductive portion, a second conductive portion, a third conductive portion, a first dielectric layer, and a second dielectric layer; and
wherein the first conductive portion and a gate of the first thin film transistor are disposed on a same layer and are spaced apart from each other, the first dielectric layer covers the first conductive portion and the gate of the first thin film transistor, the first dielectric layer is provided with a first via hole exposing an upper surface of the first conductive portion, a part of the second conductive portion is disposed in the first via hole and is in contact with the first conductive portion, the second dielectric layer covers the first dielectric layer and is provided with a second via hole exposing an upper surface of the second conductive portion, a part of the third conductive portion is disposed in the second via hole and is in contact with the second conductive portion, and the third conductive portion is in contact with a drain of the second thin film transistor.

2. The array substrate as claimed in claim 1, wherein a main material of the channel layer of the first thin film transistor is polysilicon, and a main material of the channel layer of the second thin film transistor is an amorphous oxide semiconductor.

3. The array substrate as claimed in claim 1, wherein another part of the third conductive portion and a gate of the second thin film transistor are disposed on a same layer and are spaced from each other.

4. The array substrate as claimed in claim 3, wherein main materials of the first conductive portion and the gate of the first thin film transistor are same, and/or main materials of the third conductive portion and the gate of the second thin film transistor are same.

5. The array substrate as claimed in claim 3, further comprising a gate insulating layer and a passivation layer, wherein the gate insulating layer covers the gate of the second thin film transistor and the third conductive portion, and is provided with a third via hole exposing an upper surface of the third conductive portion, a part of the drain of the second thin film transistor is disposed in the third via hole and is in contact with the third conductive portion, a source, the drain, and the channel layer of the second thin film transistor are disposed on the gate insulating layer, the source and the drain are in contact with both ends of the channel layer, and the passivation layer covers the gate insulating layer provided with the drain, the source, and the channel layer of the second thin film transistor.

6. A display panel, comprising:
   an array substrate, wherein a driving circuit of the array substrate comprises a first thin film transistor and a second thin film transistor, the second thin film transistor is disposed on a leakage path between a pull-down control node and a pull-up control node of the driving circuit, a channel layer of the second thin film transistor is disposed above a channel layer of the first thin film transistor, and orthographic projections of the two channel layers on the array substrate at least partially overlap;
   wherein the array substrate comprises a first conductive portion, a second conductive portion, a third conductive portion, a first dielectric layer, and a second dielectric layer; and
   wherein the first conductive portion and a gate of the first thin film transistor are disposed on a same layer and are spaced apart from each other, the first dielectric layer covers the first conductive portion and the gate of the first thin film transistor, the first dielectric layer is provided with a first via hole exposing an upper surface of the first conductive portion, a part of the second conductive portion is disposed in the first via hole and is in contact with the first conductive portion, the second dielectric layer covers the first dielectric layer and is provided with a second via hole exposing an upper surface of the second conductive portion, a part of the third conductive portion is disposed in the second via hole and is in contact with the second conductive portion, and the third conductive portion is in contact with a drain of the second thin film transistor.

7. The display panel as claimed in claim 6, wherein a main material of the channel layer of the first thin film transistor is polysilicon, and a main material of the channel layer of the second thin film transistor is an amorphous oxide semiconductor.

8. The display panel as claimed in claim 6, wherein another part of the third conductive portion and a gate of the second thin film transistor are disposed on a same layer and are spaced from each other.

9. The display panel as claimed in claim 8, wherein main materials of the first conductive portion and the gate of the first thin film transistor are same, and/or main materials of the third conductive portion and the gate of the second thin film transistor are same.

10. The display panel as claimed in claim 8, wherein the array substrate further comprises a gate insulating layer and a passivation layer, the gate insulating layer covers the gate of the second thin film transistor and the third conductive portion, and is provided with a third via hole exposing an upper surface of the third conductive portion, a part of the drain of the second thin film transistor is disposed in the third via hole and is in contact with the third conductive portion, a source, the drain, and the channel layer of the second thin film transistor are disposed on the gate insulating layer, the source and the drain are in contact with both ends of the channel layer, and the passivation layer covers the gate insulating layer provided with the drain, the source, and the channel layer of the second thin film transistor.

11. A manufacturing method of an array substrate, wherein a driving circuit of the array substrate comprises a first thin film transistor and a second thin film transistor, and the second thin film transistor is disposed on a leakage path between a pull-down control node and a pull-up control node of the driving circuit, and wherein the manufacturing method comprises following steps of:
   providing a substrate;
   forming the first thin film transistor and the second thin film transistor on the substrate, wherein a channel layer of the second thin film transistor is disposed above a channel layer of the first thin film transistor, and orthographic projections of the two channel layers on the array substrate at least partially overlap; and
   forming a passivation layer covering the second thin film transistor,
   wherein the step of forming the first thin film transistor and the second thin film transistor on the substrate comprises:
   forming a first channel layer with doped regions at both ends on the substrate;
   forming a first gate insulating layer covering the first channel layer;
   forming a first conductive portion and a first gate spaced apart from each other on the first gate insulating layer, wherein the first gate is disposed above the first channel layer;
   forming a first dielectric layer on the first gate insulating layer, wherein the first dielectric layer covers the first conductive portion and the first gate;
   forming a source via hole and a drain via hole passing through the first dielectric layer and the first gate insulating layer, and forming a first via hole passing through the first dielectric layer, wherein the source via hole and the drain via hole respectively expose the doped regions at both ends of the first channel layer, and the first via hole exposes an upper surface of the first conductive portion;
   forming a first source, a first drain, and a second conductive portion on the first dielectric layer, wherein the first source and the first drain are in contact with the doped region through the source via hole and the drain via hole, respectively, and a part of the second conductive portion is disposed in the first via hole and is in contact with the first conductive portion;
   forming a second dielectric layer on the first dielectric layer, wherein the second dielectric layer covers the first source, the first drain, and the second conductive portion, and the second dielectric layer is provided with a second via hole exposing an upper surface of the second conductive portion;
   forming a second gate and a third conductive portion spaced apart from each other on the second dielectric layer, wherein the second gate is disposed above the first channel layer, and a part of the third conductive portion is disposed in the second via hole and is in contact with the second conductive portion;

forming a second gate insulating layer on the second dielectric layer, wherein the second gate insulating layer covers the second gate and the third conductive portion, and the second gate insulating layer is provided with a third via hole exposing an upper surface of the third conductive portion; and forming a second source, a second drain, and a second channel layer on the second gate insulating layer, wherein the second source and the second drain are in contact with both ends of the second channel layer, and a part of the second drain is disposed in the third via hole and is in contact with the third conductive portion;

wherein the step of forming the passivation layer covering the second thin film transistor comprises:

forming the passivation layer on the second gate insulating layer, wherein the passivation layer covers the second source, the second drain, and the second channel layer.

12. The manufacturing method as claimed in claim 11, wherein a main material of the first channel layer is polysilicon, and a main material of the second channel layer is an amorphous oxide semiconductor.

13. The manufacturing method as claimed in claim 11, wherein main materials of the first conductive portion and the gate of the first thin film transistor are same, and/or main materials of the third conductive portion and the gate of the second thin film transistor are same.

* * * * *